US011326871B2

(12) United States Patent
Ohba

(10) Patent No.: US 11,326,871 B2
(45) Date of Patent: May 10, 2022

(54) HEIGHT DETECTION APPARATUS AND COATING APPARATUS EQUIPPED WITH THE SAME

(71) Applicant: NTN CORPORATION, Osaka (JP)

(72) Inventor: Hiroaki Ohba, Iwata (JP)

(73) Assignee: NTN CORPORATION, Osaka (JP)

(*) Notice: Subject to any disclaimer, the term of this patent is extended or adjusted under 35 U.S.C. 154(b) by 0 days.

(21) Appl. No.: 16/998,889

(22) Filed: Aug. 20, 2020

(65) Prior Publication Data

US 2020/0378748 A1    Dec. 3, 2020

Related U.S. Application Data

(62) Division of application No. 15/775,289, filed as application No. PCT/JP2016/083094 on Nov. 8, 2016.

(30) Foreign Application Priority Data

Nov. 12, 2015  (JP) .............................. JP2015-222091
Aug. 29, 2016  (JP) .............................. JP2016-166607

(51) Int. Cl.
 *G01B 9/0209* (2022.01)
 *G01B 11/06* (2006.01)
 (Continued)

(52) U.S. Cl.
 CPC .......... *G01B 11/0675* (2013.01); *B05C 1/027* (2013.01); *B05C 5/02* (2013.01);
 (Continued)

(58) Field of Classification Search
 CPC ............ G01B 11/0675; G01B 11/0608; G01B 11/0683; G01B 9/02012; G01B 9/0209;
 (Continued)

(56) References Cited

U.S. PATENT DOCUMENTS 4,639,139 A * 1/1987 Wyant ................ G01B 11/2441
356/497
4,902,137 A  2/1990 Krieg et al.
(Continued)

FOREIGN PATENT DOCUMENTS

CN    1414377 A    4/2003
CN    1592841 A    3/2005
(Continued)

OTHER PUBLICATIONS

Chinese Office Action issued in corresponding Chinese Patent Application No. 201680066070.4, dated Jun. 10, 2020, with English translation.
(Continued)

*Primary Examiner* — Jonathan M Hansen
(74) *Attorney, Agent, or Firm* — McDermott Will & Emery LLP

(57) ABSTRACT

A height detection apparatus successively changes the brightness of white light from a first level to a second level in accordance with a position of a Z stage and captures an image of interference light while moving a two-beam interference objective lens relative to a paste film in an optical axis direction, detects, as a focus position, a position of the Z stage where the intensity of interference light is highest in a period during which the brightness of white light is set to the first or second level, for each pixel of the captured image, and obtains the height of the paste film based on a detection result.

7 Claims, 14 Drawing Sheets

(51) Int. Cl.
  *B05C 11/10* (2006.01)
  *B05C 1/02* (2006.01)
  *G01B 9/02001* (2022.01)
  *B05C 5/02* (2006.01)

(52) U.S. Cl.
  CPC ........ *B05C 11/1018* (2013.01); *G01B 9/0209* (2013.01); *G01B 9/02012* (2013.01); *G01B 11/0608* (2013.01); *G01B 11/0683* (2013.01); *G01B 2210/48* (2013.01)

(58) Field of Classification Search
  CPC ....... G01B 2210/48; B05C 1/027; B05C 5/02; B05C 11/1018
  See application file for complete search history.

(56) References Cited

U.S. PATENT DOCUMENTS

| | | | | |
|---|---|---|---|---|
| 5,136,172 | A * | 8/1992 | Nakata | G01N 21/1702 250/559.39 |
| 8,649,024 | B2 | 2/2014 | Colonna de Lega | |
| 10,845,190 | B2 * | 11/2020 | Yoshino | G01B 11/02 |
| 2003/0090669 | A1 | 5/2003 | Jung et al. | |
| 2008/0123103 | A1 * | 5/2008 | Fujii | G01B 11/2441 356/496 |
| 2015/0002852 | A1 | 1/2015 | de Groot et al. | |
| 2018/0252512 | A1 * | 9/2018 | Ohba | G01B 11/0675 |

FOREIGN PATENT DOCUMENTS

| | | |
|---|---|---|
| CN | 1320334 C | 6/2007 |
| CN | 102095371 A | 6/2011 |
| CN | 104634278 A | 5/2015 |
| JP | 08-159725 A | 6/1996 |
| JP | 2003-139517 A | 5/2003 |
| JP | 2006-072307 A | 3/2006 |
| JP | 2006-162523 A | 6/2006 |
| JP | 2007-268354 A | 10/2007 |
| JP | 2008-191091 A | 9/2008 |
| JP | 2012-124381 A | 6/2012 |
| JP | 2015-007564 A | 1/2015 |
| WO | 94/18523 A1 | 8/1894 |
| WO | 03/036229 A1 | 5/2003 |
| WO | 03/058163 A1 | 7/2003 |
| WO | 03/078925 A2 | 9/2003 |

OTHER PUBLICATIONS

Non-Final Office Action issued in U.S. Appl. No. 15/775,289, dated May 3, 2019.
Final Office Action issued in U.S. Appl. No. 15/775,289, dated Aug. 30, 2019.
Non-Final Office Action issued in U.S. Appl. No. 15/775,289, dated Mar. 18, 2020.
Supplemental European Search Report issued in corresponding European Patent Application No. 16864206.4, dated Jun. 26, 2019.
Chinese Office Action issued in corresponding Chinese Application No. 201680066070.4, dated Sep. 30, 2019, with English translation.
Taiwanese Office Action issued in corresponding Taiwan Paten Application No. 105136584, dated Nov. 12, 2020, with English translation.
International Search Report issued in corresponding International Patent Application No. PCT/JP2016/083094, dated Jan. 17, 2017.

* cited by examiner

FIG.6
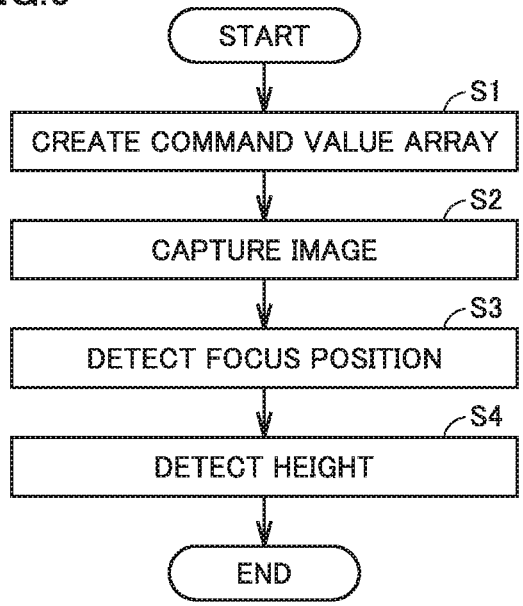
FIG.7
| NUMBER | COORDINATE VALUE Zp OF Z STAGE | IRIS VALUE Ip |
|---|---|---|
| 1 | 0 | 15 |
| 2 | 10 | 25 |
FIG.8
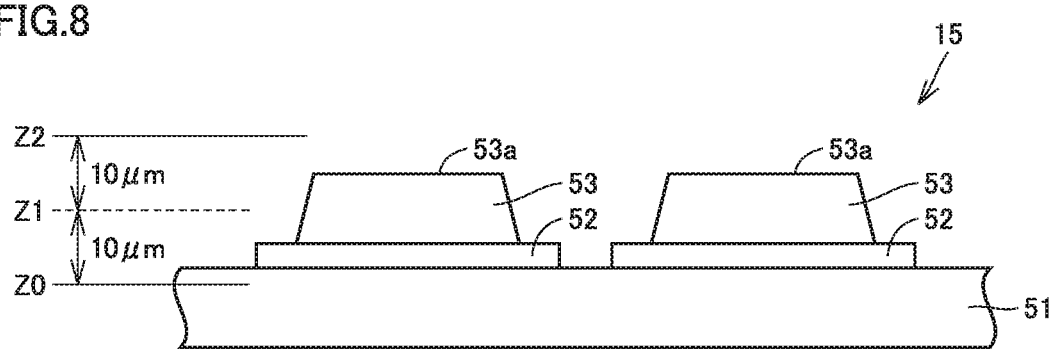

FIG.10
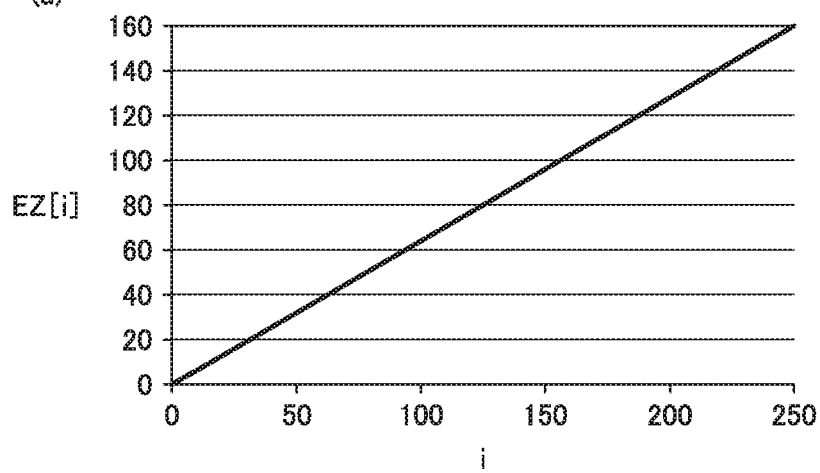
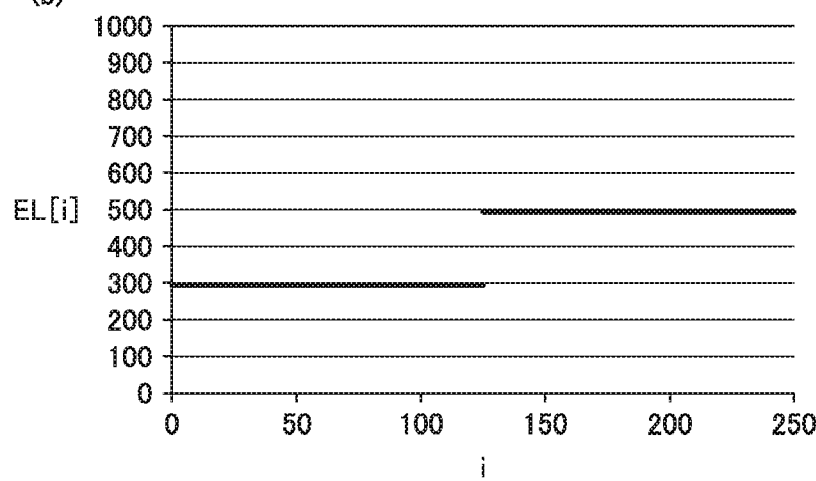
FIG.11
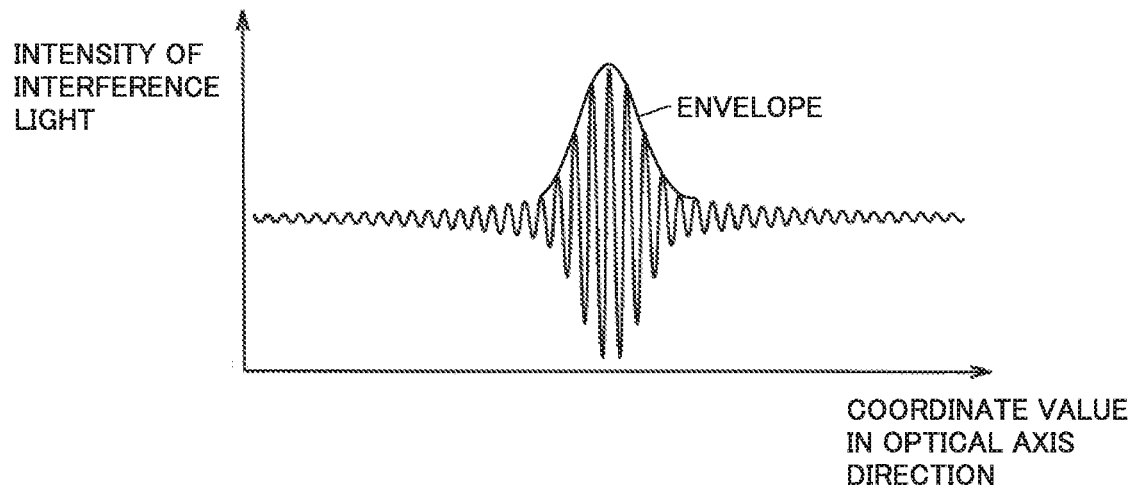

(a) IMMEDIATELY AFTER COATING MATERIAL ADHERES (c) AFTER ELAPSE OF TIME

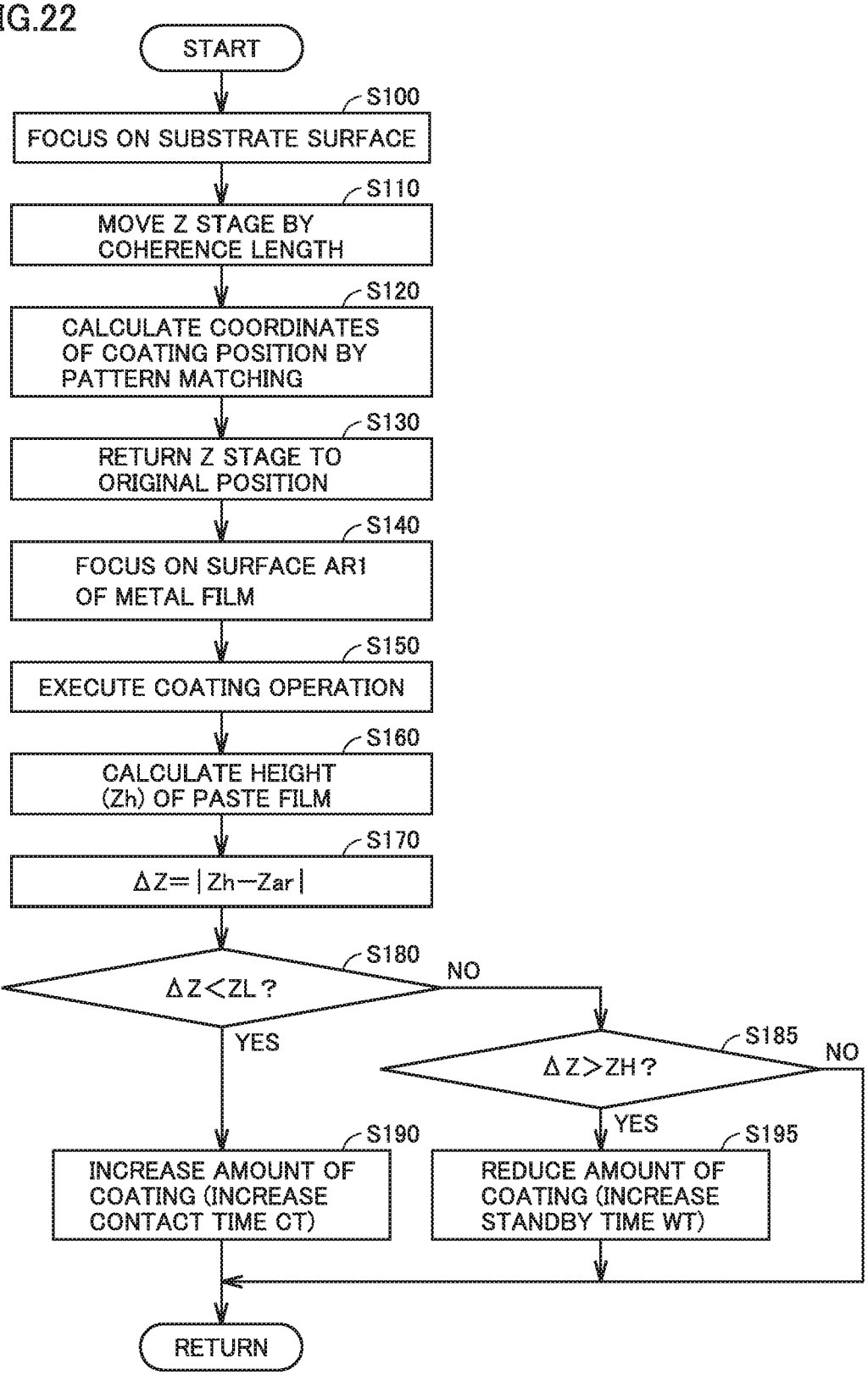

HEIGHT DETECTION APPARATUS AND COATING APPARATUS EQUIPPED WITH THE SAME

RELATED APPLICATIONS

This application is a divisional of U.S. application Ser. No. 15/775,289, filed May 10, 2018, which is the U.S. National Phase under 35 U.S.C. § 371 of International Application No. PCT/JP2016/083094, filed on Nov. 8, 2016 which in turn claims the benefit of Japanese Patent Application No. 2015-222091, filed on Nov. 12, 2015 and Japanese Patent Application No. 2016-166607, filed on Aug. 29, 2016, the disclosures of which applications are incorporated by reference herein.

TECHNICAL FIELD

The present invention relates to a height detection apparatus and a coating apparatus equipped with the same, and more specifically to a height detection apparatus that detects the height of a target object. More specifically, the present invention relates to a height detection apparatus for inspecting the shapes of metal, resin, and workpieces thereof or inspecting the shapes of substrate surfaces of semiconductor substrates, printed circuit boards, and flat panel displays.

BACKGROUND ART

Japanese Patent Laying-Open No. 2015-7564 (PTD 1) discloses a height detection method including: positioning a two-beam interference objective lens above an ink-coated portion formed of ink applied on a surface of a substrate; thereafter capturing an image of interference light while moving a Z stage; obtaining the position of the Z stage where the contrast value reaches a peak for each of a plurality of pixels forming the captured image; and obtaining the height of the ink-coated portion based on the obtained position of the Z stage.

CITATION LIST

Patent Document

PTD 1: Japanese Patent Laying-Open No. 2015-7564
PTD 2: Japanese Patent Laying-Open No. 2007-268354

SUMMARY OF INVENTION

Technical Problem

However, when the relative height of a paste film (target object) is detected with reference to the height of a metal film (see FIG. 8), for example, the following problem may arise. When the particle size in the metal film is as small as a few nm to a few tens of nm, the surface is smooth, regular reflected light is easily obtained, and the intensity of interference light is high. By contrast, when the particle size of the material included in the paste is large, the reflected light scatters due to surface roughness, and the intensity of interference light is low.

In such a case, the intensity of interference light greatly differs between the metal film and the paste film. When the brightness of white light is increased in order to increase the intensity of interference light corresponding to the paste film, the intensity of interference light corresponding to the metal film becomes so high that the brightness of the image of the interference light may be saturated. In the state in which the brightness of the image is saturated, it is impossible to accurately detect the peak of the contrast value, and it is impossible to accurately detect the height of the paste film with reference to the surface of the metal film.

Therefore, a main object of the present invention is to provide a height detection apparatus capable of accurately detecting the height of a target object.

Solution to Problem

A height detection apparatus according to the present invention detects the height of a target object. The height detection apparatus includes: a light source configured to emit white light; a two-beam interference objective lens configured to divide white light emitted from the light source into two light beams, apply one of the two light beams to the target object and the other light beam to a reference surface, and cause interference between reflected light from the target object and reflected light from the reference surface to obtain interference light; an imaging device configured to capture an image of interference light obtained by the two-beam interference objective lens; a Z stage configured to move the two-beam interference objective lens relative to the target object in an optical axis direction; and a control device configured to control the light source, the imaging device, and the Z stage to obtain a height of the target object. The control device successively changes brightness of the white light in first to K-th levels in accordance with a position of the Z stage and captures an image of the interference light while moving the two-beam interference objective lens relative to the target object in the optical axis direction, detects, as a focus position, a position of the Z stage where intensity of the interference light is highest in a period during which the brightness of the white light is set to the k-th level, for each pixel of the captured image, and obtains the height of the target object based on a detection result, where K is an integer equal to or greater than two, and k is any integer from 1 to K.

Advantageous Effects of Invention

The height detection apparatus according to the present invention successively changes the brightness of white light in first to K-th levels in accordance with the position of the Z stage and captures an image of interference light while moving the two-beam interference objective lens relative to the target object in the optical axis direction, detects, as a focus position, the position of the Z stage where the intensity of interference light is highest in a period during which the brightness of white light is set to the k-th level, for each pixel of the captured image, and obtains the height of the target object based on the detection result. Since the level of the brightness of white light is set in accordance with the properties of the target object and the vicinity thereof, the height of the target object can be detected accurately.

BRIEF DESCRIPTION OF DRAWINGS

FIG. 6 is a flowchart illustrating the operation of the control device illustrated in FIG. 5.

FIG. 7 is a diagram illustrating a command value correspondence table.

FIG. 8 is a diagram illustrating a configuration of a work.

FIG. 10 is a diagram illustrating a position command value array and an illumination command value array.

FIG. 11 is a diagram for explaining a method of detecting a focus position.

FIG. 22 is a flowchart illustrating the process of applying paste and adjusting the amount of coating executed in the coating apparatus.

DESCRIPTION OF EMBODIMENTS

[Configuration of Height Detection Apparatus]

Figure 1:
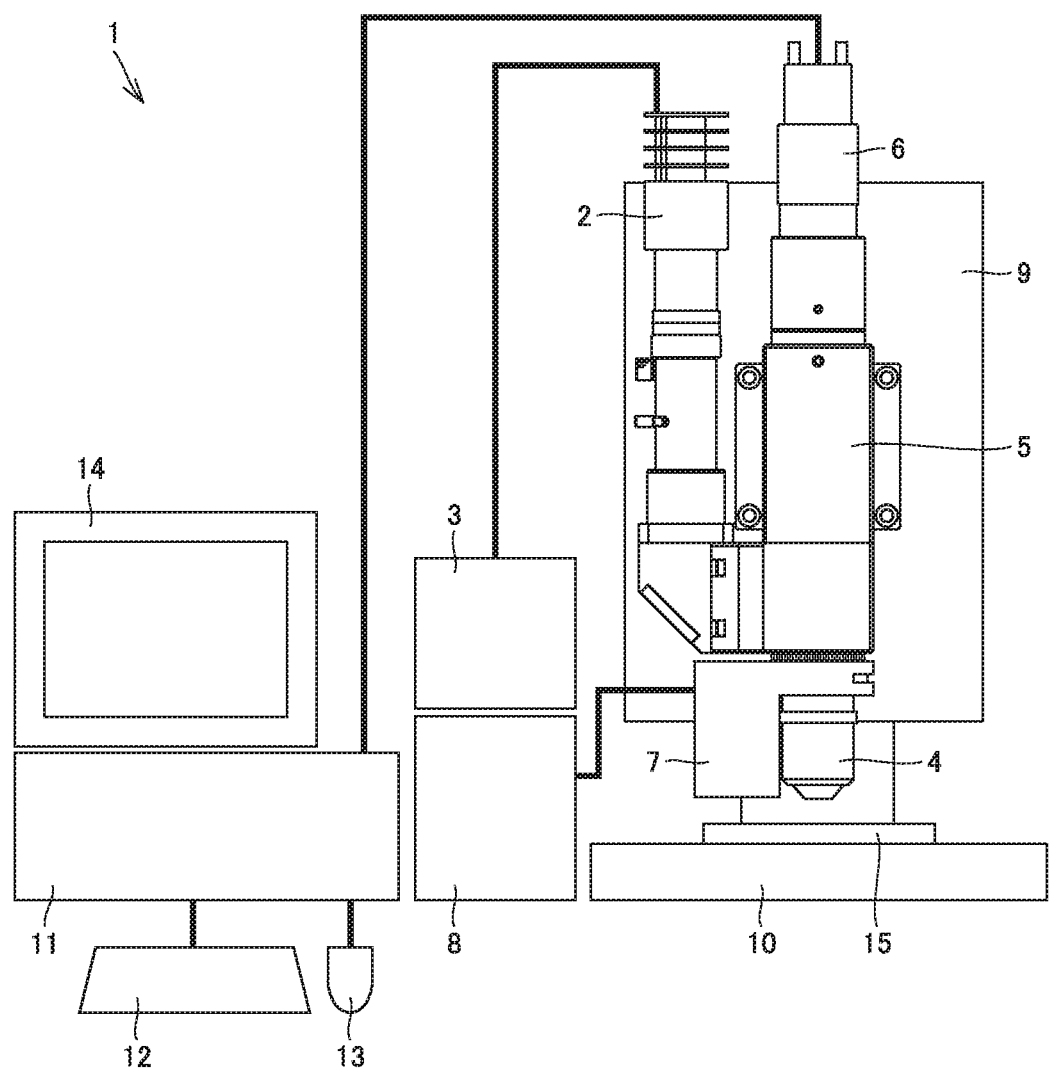
FIG. 1 is a block diagram illustrating a configuration of a height detection apparatus according to an embodiment of the present invention.

FIG. 1 is a block diagram illustrating a configuration of a height detection apparatus 1 according to an embodiment of the present invention. In FIG. 1, this height detection apparatus 1 includes a light source 2, a light source controller 3, a two-beam interference objective lens 4, an observation optical system 5, an imaging device 6, a Z stage 7, a Z stage controller 8, a support member 9, a base plate 10, a control device 11, a keyboard 12, a mouse 13, and a monitor 14. Observation optical system 5 is fixed to base plate 10 with support member 9 interposed. A flat plate-shaped work 15 is mounted on a surface of base plate 10. Height detection apparatus 1 detects the height of a target object on the surface of work 15 (see FIG. 8).

Light source 2 is provided on a side surface of observation optical system 5 to emit white light. Light source controller 3 is connected to light source 2 to control the brightness of white light in accordance with an illumination command value array (second command value array) from control device 11. Light source controller 3 controls the brightness of white light, for example, by controlling current supplied to light source 2. White light emitted from light source 2 enters two-beam interference objective lens 4 through observation optical system 5.

Two-beam interference objective lens 4 is provided at a lower end of observation optical system 5 with Z stage 7 interposed to divide white light from light source 2 into two light beams. One of the light beams is applied to the surface of work 15 and the other light beam is applied to a reference surface, causing interference between reflected light from the surface of work 15 and reflected light from the reference surface to generate interference light.

Observation optical system 5 is provided to observe interference light generated by two-beam interference objective lens 4. Imaging device 6 is controlled by control device 11 to capture an image of interference light through observation optical system 5 in a constant cycle and provide the captured image to control device 11.

Z stage 7 is provided at a lower end of observation optical system 5 to move two-beam interference objective lens 4 up and down. Z stage controller 8 moves Z stage 7 in the up/down direction in accordance with a position command value array (first command value array) from control device 11.

Control device 11 is configured, for example, with a personal computer.

Control device 11 is connected to keyboard 12, mouse 13, and monitor 14. The user of height detection apparatus 1 uses keyboard 12 and mouse 13 to give a command to control device 11, for example, for starting and stopping height direction. Control device 11 controls the entire height detection apparatus 1 in accordance with a signal from keyboard 12, mouse 13, and the like to obtain the height of work 15. Monitor 14 displays the command from the operator, the detected height, and the like.

[Principle of Height Detection]

In the present embodiment, a Mirau interference objective lens is used as two-beam interference objective lens 4. Although a Mirau interference objective lens is used in the present embodiment, a Michelson or Linnik interference objective lens may be used. A white light source is used as light source 2. White light is suitable for detecting height because the brightness of interference light is highest at a focal position of a lens, unlike a single wavelength light source such as a laser.

Figure 2:
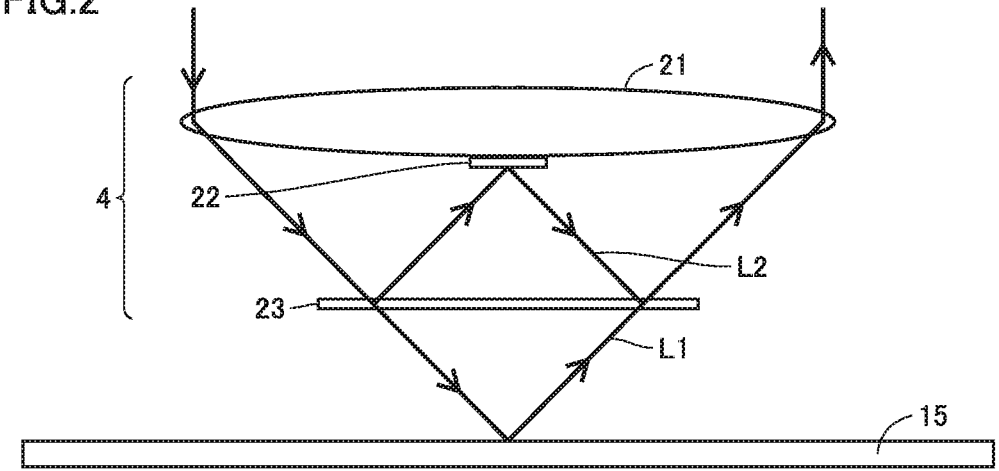
FIG. 2 is a diagram illustrating a configuration of a two-beam interference objective lens illustrated in FIG. 1.

Two-beam interference objective lens 4 includes a lens 21, a reference mirror 22, and a beam splitter 23 as illustrated in FIG. 2. Reference mirror 22 is provided at the center of a lower surface of lens 21. Beam splitter 23 is provided below lens 21. Light incident on lens 21 is split by beam splitter 23 into light passing through in the direction of work 15 and light reflected in the direction of reference mirror 22. Light L1 reflected by the surface of work 15 and light L2 reflected by the surface of reference mirror 22 are merged again at beam splitter 23 and collected by lens 21.

Figure 3:
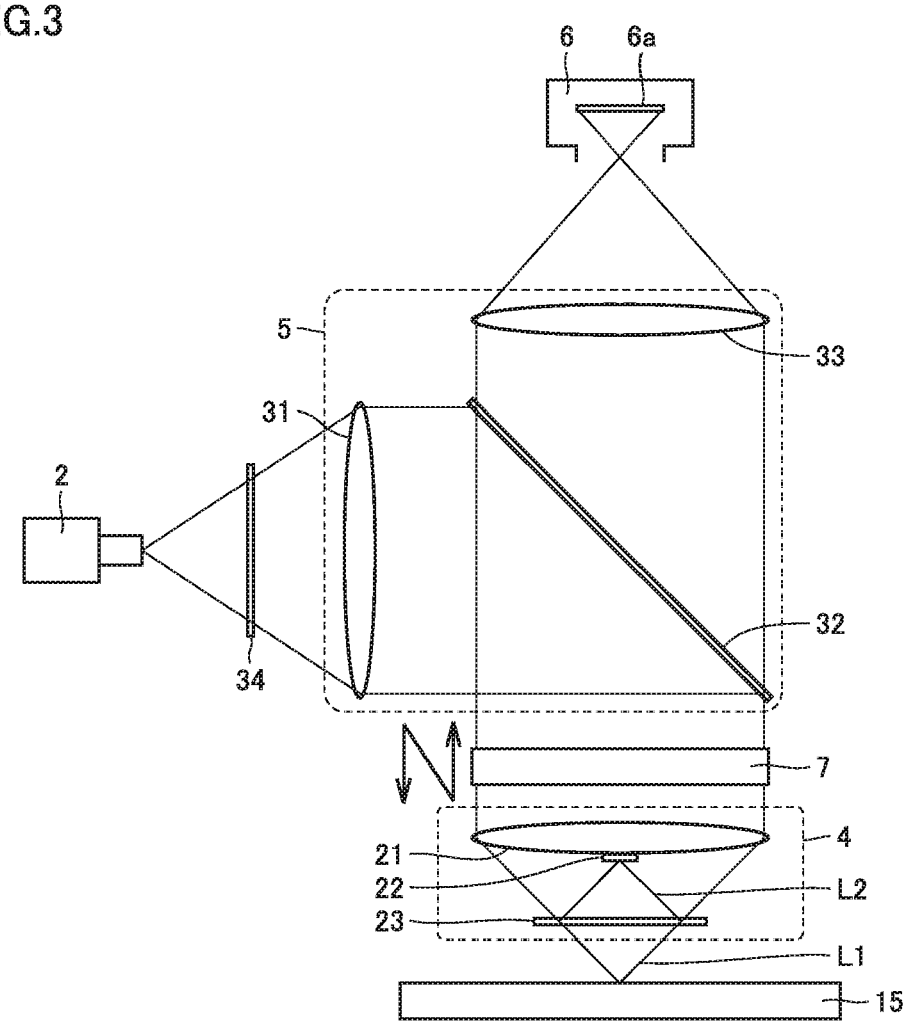
FIG. 3 is a diagram illustrating the layout of optical elements including the two-beam interference objective lens and an observation optical system illustrated in FIG. 1.

FIG. 3 is a diagram illustrating the layout of optical elements including two-beam interference objective lens 4 and observation optical system 5. In FIG. 3, observation optical system 5 includes a condenser lens 31, a half mirror 32, and an image lens 33. The optical axis of two-beam interference objective lens 4 coincides with the optical axis of image lens 33, and both axes are directed in the vertical direction (up-down direction) and pass through the center of an imaging plane 6a of imaging device 6. The optical axis of light source 2 coincides with the optical axis of image lens 33, and both axes are directed in the horizontal direction (lateral direction) and orthogonal to the optical axis of two-beam interference objective lens 4. Half mirror 32 is provided at the intersection of the optical axis of light source 2 and the optical axis of two-beam interference objective lens 4 and is disposed at an angle of 45 degrees with respect to each of the optical axis of light source 2 and the optical axis of two-beam interference objective lens 4. A filter 34 is provided between light source 2 and condenser lens 31 for removing light of unnecessary wavelengths.

Light emitted from light source 2 and passing through filter 34 is reflected by half mirror 32 in the direction of lens 21. Light incident on lens 21 is split by beam splitter 23 into two beams of light, namely, light passing through in the direction of work 15 and light reflected in the direction of reference mirror 22. The beams of light reflected by the surfaces of work 15 and reference mirror 22 are merged again at beam splitter 23 and collected by lens 21. Light exiting from lens 21 then passes through half mirror 32 and enters imaging plane 6a of imaging device 6 through image lens 33.

On imaging plane 6a, interference light of light L1 reflected by the surface of work 15 and light L2 reflected by the surface of reference mirror 22 are imaged. The intensity of interference light changes with the optical path length difference between reflected light L1 and reflected light L2 and changes as illustrated in FIG. 4 when two-beam interference objective lens 4 is moved in the optical axis direction.

Figure 4:
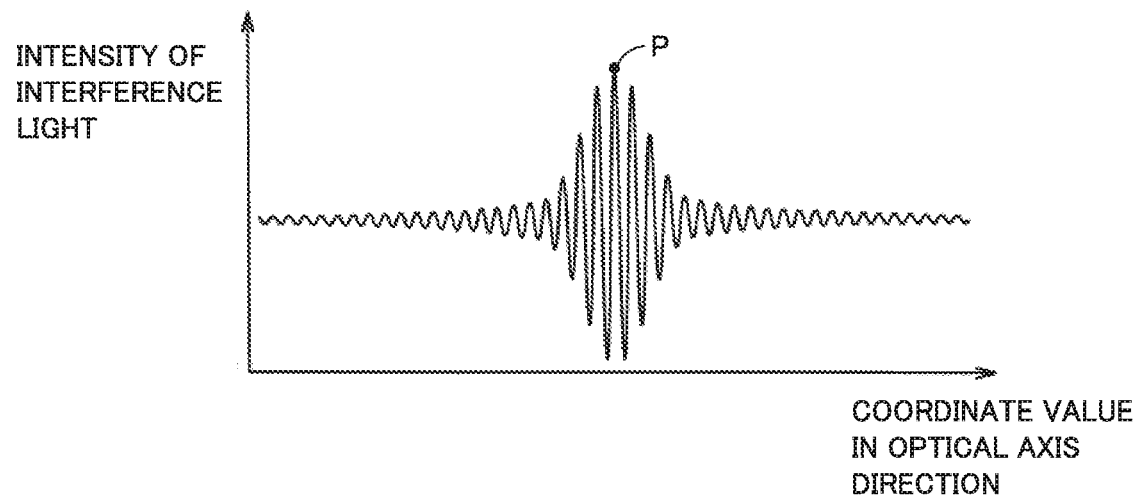
FIG. 4 is a diagram illustrating the relation between the position of Z stage 7 illustrated in FIG. 3 and the intensity of interference light.

The horizontal axis in FIG. 4 represents the coordinates in the optical axis direction (the position of Z stage 7), and the vertical axis in FIG. 4 represents the intensity of interference light. The intensity of interference light oscillates around a certain value in a constant cycle in accordance with the position of Z stage 7. The amplitude of intensity of interference light is highest when the position of Z stage 7 is a certain position. At point P at which the intensity of interference light is highest, the optical path length difference between reflected light L1 and reflected light L2 is zero. At this point of time, two-beam interference objective lens 4 is in focus on the surface of work 15.

In the present embodiment, an image is captured by imaging device 6 while two-beam interference objective lens 4 is moved in the optical axis direction by Z stage 7, the image is processed, and the position of Z stage 7 in the optical axis direction where the intensity of interference light is highest is obtained for each pixel. The positions are compared between pixels, whereby the relative height between two positions of work 15 is obtained.

Instead of moving two-beam interference objective lens 4 with Z stage 7, work 15 itself may be moved up and down on a table, or, for example, a piezo table may be attached to a joint portion of observation optical system 5 or support member 9 so that the up-down position of two-beam interference objective lens 4 is adjusted.

[Configuration of Control Device]

Figure 5:
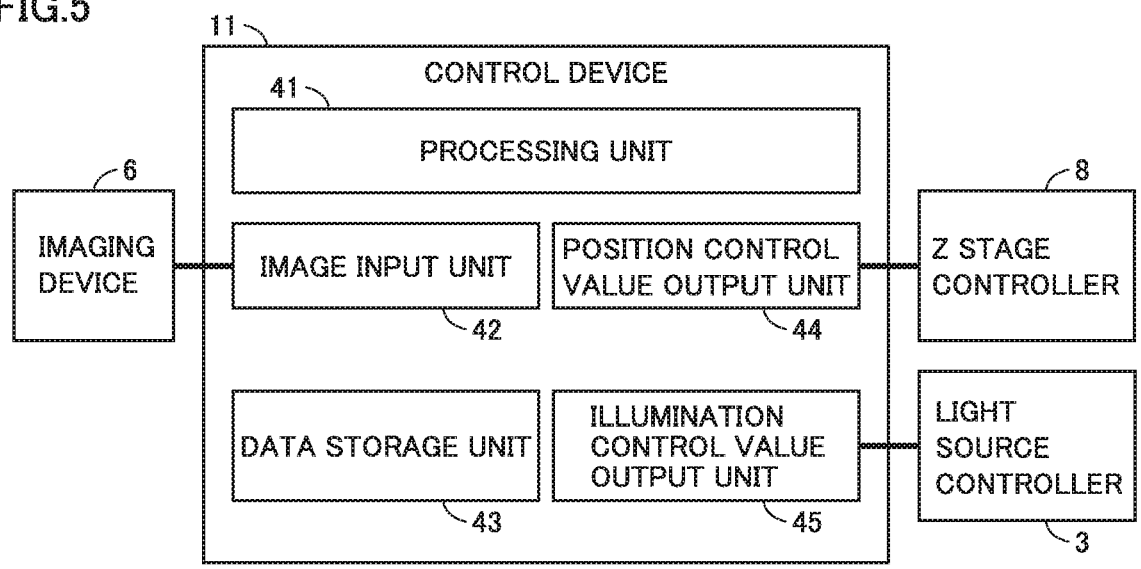
FIG. 5 is a block diagram illustrating a configuration of a control device illustrated in FIG. 1.

FIG. 5 is a block diagram illustrating a configuration of control device 11. In FIG. 5, control device 11 includes a processing unit 41, an image input unit 42, a data storage unit 43, a position control value output unit 44, and an illumination control value output unit 45.

Processing unit 41 generates a position command value array for controlling the position of Z stage 7 such that Z stage 7 moves at a constant speed and an illumination command value array for controlling the brightness of white light in accordance with the position of Z stage 7, based on information provided using keyboard 12, mouse 13, and the like, and writes the generated position command value array and illumination command value array into data storage unit 43.

Position control value output unit 44 outputs control voltage EZ in accordance with the position command value array read from data storage unit 43. Z stage controller 8 moves Z stage 7 to a position corresponding to control voltage EZ output from position control value output unit 44. Although the position of Z stage 7 is controlled by control voltage EZ here, the embodiments are not limited thereto, and any form that can be accepted by Z stage controller 8 may be employed.

Illumination control value output unit 45 outputs control voltage EL in accordance with the illumination command value array read from data storage unit 43. Light source controller 3 changes the brightness of white light in accordance with control voltage EL output from illumination control value output unit 45. Although the brightness of white light is controlled by control voltage EL here, the embodiments are not limited thereto, and any form that can be accepted by light source controller 3 may be employed.

Image input unit 42 samples an image captured by imaging device 6 in a constant cycle and stores the sampled image into data storage unit 43. Processing unit 41 obtains the height of work 15 based on a plurality of images stored in data storage unit 43.

[Height Detection Operation]

FIG. 6 is a flowchart illustrating the operation of control device 11. In FIG. 6, control device 11 creates a position command value array and an illumination command value array at step S1, captures an image of interference light at step S2, detects the focus position in each pixel at step S3, and detects the height of a target object on the surface of work 15 at step S4. Steps S1 to S4 will be described in detail below.

First of all, step S1 of creating a command value array will be described. At step S1, processing unit 41 creates a command value array for associating control voltages EZ, EL, for example, based on a command value correspondence table illustrated in FIG. 7, and stores the created command value array into data storage unit 43. The command value correspondence table is stored in data storage unit 43.

The command value correspondence table in FIG. 7 indicates that when a coordinate value Z (the position in the optical axis direction) of Z stage 7 reaches a predetermined value Zp, an iris value I is changed to a value Ip. For example, when coordinate value Z of Z stage 7 reaches 10 μm, iris value I is changed from 15 to 25. The level of the brightness of white light is changed in accordance with iris value I.

Although iris value I is changed in two stages in FIG. 7, the embodiments are not limited thereto. Iris value I may be changed in any stages equal to or greater than three. That is, iris value I can be changed in K stages (where K is an integer equal to or greater than two). The level of the brightness of white light can be changed in K stages.

The command value correspondence table in FIG. 7 is intended for measurement of the height of work 15, for example, having a three-dimensional structure as illustrated in FIG. 8. In FIG. 8, work 15 includes a substrate 51. A plurality of metal films 52 are formed on a surface of substrate 51, and a paste film 53 is formed at the center of each metal film 52. The design value of the film thickness of metal film 52 is 3 μm, and the design value of the film thickness of paste film 53 is 10 μm. In actuality, paste film 53 is produced at a precision of 10 μm±1 μm with reference to the surface of metal film 52.

In the present embodiment, the height of paste film 53 (the distance from the surface of metal film 52 to surface 53a of paste film 53) is detected with reference to the surface of metal film 52. The surface of paste film 53 is coarser than the surface of metal film 52, and therefore, when white light with the same brightness is applied to paste film 53 and metal film 52, the intensity of interference light corresponding to paste film 53 is smaller than the intensity of interference light corresponding to metal film 52.

Then, in the present embodiment, measurement is started from a position Z0, 5 μm below the surface of metal film 52. At a position Z1 where the coordinates Z of Z stage 7 reach 10 μm, iris value I is changed from 15 to 25, and at position Z2 where Z stage 7 further moves by 10 μm, the measurement is terminated. After the measurement, the relative height of surface 53a of paste film 53 is detected with reference to the height of the surface of metal film 52.

In this way, at a position where the intensity of interference light is small, iris value I is changed to a large value to enhance an intensity change of interference light, thereby facilitating detection of a peak of the intensity of interference light.

Figure 9:
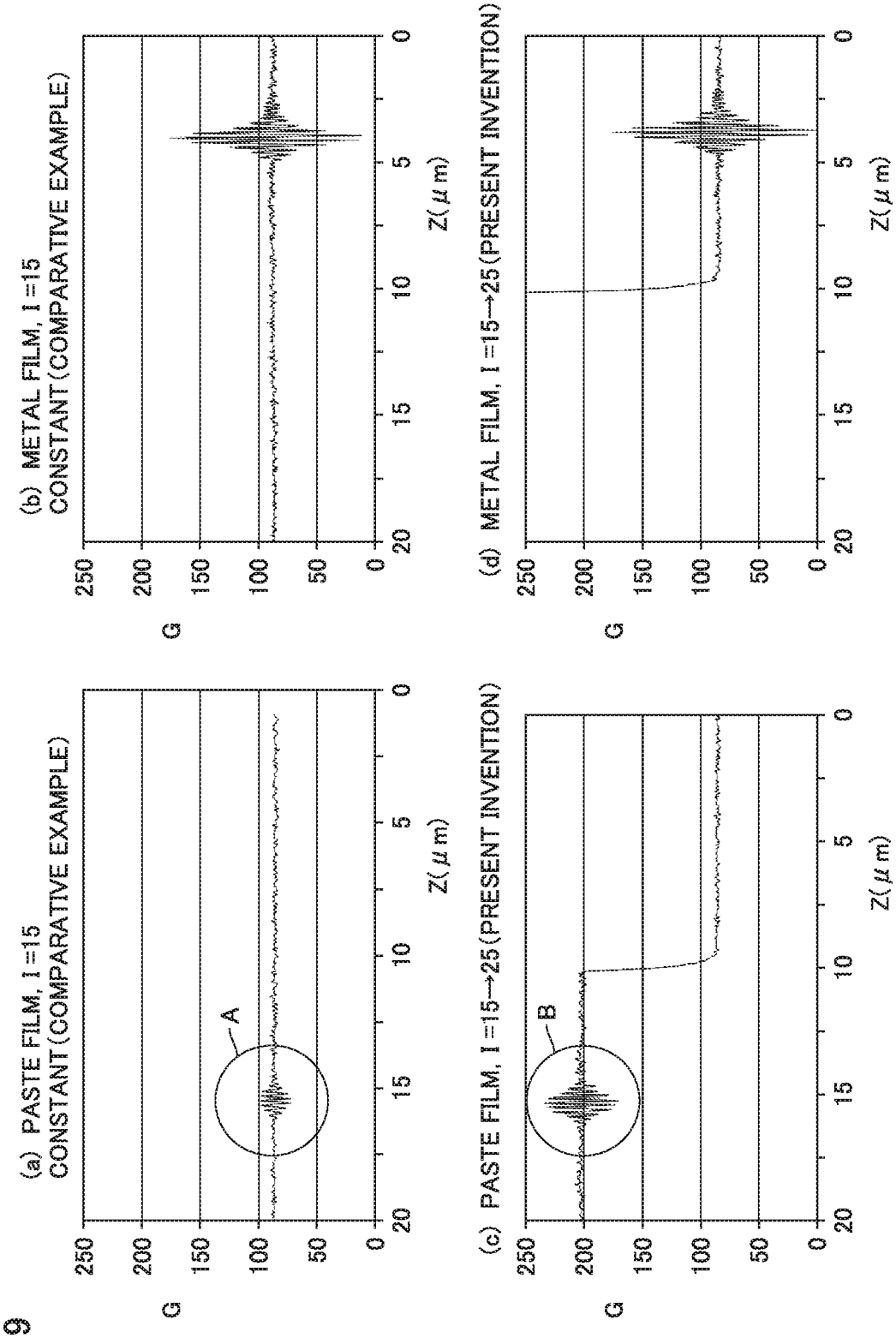
FIG. 9 is a diagram illustrating the relation between the position of the Z stage and the luminance of interference light.

FIGS. 9(a) and 9(c) are diagrams illustrating the relation between luminance G of a pixel corresponding to surface 53a of paste film 53 in the image of interference light and the position Z of Z stage 7. FIGS. 9(b) and 9(d) are diagrams illustrating the relation between luminance G of a pixel corresponding to the surface of metal film 52 in the image of interference light and the position Z of Z stage 7. In FIGS. 9(a) to 9(d), the origin of position Z is position Z0 which is 5 μm below the surface of metal film 52.

FIGS. 9(a) and 9(b) illustrate a comparative example, in which iris value I is kept at a constant value (15) in the entire range (Z0 to Z2) of 0 to 20 μm. FIGS. 9(c) and 9(d) illustrate an example of the present invention, in which iris value I is set to 15 in the first half (Z0 to Z1) of the range, namely, 0 to 10 μm, and iris value I is increased to 25 in the latter half (Z1 to Z2) of the range, namely, 10 to 20 μm.

As illustrated in FIG. 9(a), the amplitude of luminance G of the pixel corresponding to surface 53a of paste film 53 increases in the vicinity where the position Z of Z stage 7 is past 15 μm, and luminance G is highest at the position of Z≈115.5 μm. As illustrated in FIG. 9(b), the amplitude of luminance G of the pixel corresponding to the surface of metal film 52 increases in the vicinity where the position Z of Z stage 7 is past 3 μm, and luminance G is highest at the position of Z≈4 μm.

In FIGS. 9(a) and 9(b), since iris value I is kept at constant value (15) in the entire range (0 to 20 μm), the center of amplitude of luminance G of the pixel is almost constant. In the corresponding pixel of metal film 52, the amplitude of luminance G is large, whereas in the corresponding pixel of paste film 53, the amplitude of luminance G is small. If the amplitude of luminance G of the pixel is small, it is difficult to detect the maximum point of luminance G.

Also in FIG. 9(c), in the same manner as in FIG. 9(a), the amplitude of luminance G of a pixel corresponding to surface 53a of paste film 53 increases in the vicinity where the position Z of Z stage 7 is past 15 μm, and luminance G is highest at the position of Z≈15.5 μm. Also in FIG. 9(d), in the same manner as in FIG. 9(b), the amplitude of luminance G of a pixel corresponding to the surface of metal film 52 increases in the vicinity where the position Z of Z stage 7 is past 3 μm, and luminance G is highest at the position of Z≈4 μm.

In FIGS. 9(c) and 9(d), since iris value I is changed from 15 to 25 at the position (Z1) of Z=10 μm, the center of amplitude of luminance G of the pixel increases at the position (Z1) of Z=10 μm. The amplitude of luminance G of the pixel in FIG. 9(c) (see the portion surrounded by circle B) is larger than the amplitude of luminance G of the pixel in FIG. 9(a) (see the portion surrounded by circle A). When the amplitude of luminance G of the pixel is large, the maximum point of luminance G is easily detected. In FIG. 9(d), luminance G of the pixel is saturated in the latter half of the range, namely, 10 to 20 μm, but this does not matter because the amplitude of luminance G of the pixel corresponding to metal film 52 does not become largest in this range.

Coordinate value Z of Z stage 7 and control voltage EZ can be related by Equation (1) below.

$$EZ = Z(EZ\max - EZ\min)/(Z\max - Z\min) \qquad (1)$$

In the present embodiment, $EZ\max=10$ (V), $EZ\min=0$ (V), $Z\max=100$ (μm), and $Z\min=0$ (μm). Therefore, we obtain $EZ=Z/10$.

Iris value I and control voltage EL are related by Equation (2) below.

$$EL = I(EL\max - EL\min)/(I\max - I\min) \qquad (2)$$

In the present embodiment, $EL\max=5$ (V), $EL\min=0$ (V), $I\max=255$, and $I\min=0$. Therefore, we obtain $EL=I/51$.

Based on the values described above and the settings in FIG. 7, a command value array is created as follows. That is, it is assumed that Z stage 7 moves at a constant speed v (μm/sec) while an image is captured, and Z stage 7 does not stop during image capturing. Letting a constant time interval be Δt and a number denoting an element of the command value array be i, we obtain $Z=i\times\Delta t\times v$. This is substituted into Equation (1) above, and then the i-th position command value EZ[i] is represented by Equation (3) below.

$$EZ[i] = i \times \Delta t \times v (EZ\max - EZ\min)/(Z\max - Z\min) \qquad (3)$$

The number (integer) N of elements of the array is $N=D/(\Delta t \times v)$, where D (μm) is the moving distance of Z stage 7.

When a function that returns the minimum iris value Ip satisfying $Zp \leq Z$ in FIG. 7 is written as If(Z), the i-th illumination command value EL[i] is represented by Equation (4) below.

$$EL[i] = If(Z) \times (EL\max - EL\min)/(I\max - I\min) \qquad (4)$$

FIG. 10(a) is a diagram illustrating a position command value array, and FIG. 10(b) is a diagram illustrating an illumination command value array. In FIG. 10(a), the horizontal axis represents the number i indicating an element of the position command value array, and the vertical axis represents the position command value EZ[i]. The position command value EZ[i] increases in proportion to i. In FIG. 10(b), the horizontal axis represents the number i indicating an element of the illumination command value array, and the vertical axis represents the illumination command value EL[i]. In the range in which i is 0 to 124, the illumination command value EL[i] is kept at 300, and in the range in which i is 125 to 250, the illumination command value EL[i] is kept at 500. That is, illumination command value EL[i] is changed from 300 to 500 when i reaches 125. In FIGS. 10(a) and 10(b), the position command value EL[i] and the illumination command value EL[i] are each expressed in units of millivolts.

Next, step S2 of capturing an image will be described. At step S2, control device 11 captures an image of interference light while controlling the position of Z stage 7 and the brightness of white light based on the position command value array and the illumination command value array created at step S1.

That is, in response to a starting trigger from the processing unit 41, position control value output unit 44 and illumination control value output unit 45 start outputting control voltages EZ, EL, respectively. Position control value output unit 44 successively refers to the position command value array from the top and changes control voltage EZ at constant time intervals $\Delta t$ (sec). When reaching the last element number i of the position command value array, position control value output unit 44 finishes outputting control voltage EZ. Control voltage EZ increases at a constant ratio over time, in the same manner as position command value EZ[i] illustrated in FIG. 10(a).

Illumination control value output unit 45 successively refers to the illumination command value array from the top and changes control voltage EL at constant time intervals $\Delta t$ (sec). When reaching the last element number i of the illumination command value array, the illumination control value output unit 45 finishes outputting control voltage EL. Control voltage EL is changed in two stages over time, in the same manner as illumination command value EL[i] illustrated in FIG. 10(b).

In response to the starting trigger from processing unit 41, image input unit 42 starts loading an image from imaging device 6 and sequentially stores the loaded images into data storage unit 43. Imaging device 6 outputs an image in a constant cycle $\Delta T$ (sec). Image input unit 42 loads this image in the same cycle $\Delta T$ (sec) as imaging device 6 and transfers the loaded image to data storage unit 43. Images are transferred to data storage unit 43 by DMA (Direct Memory Access). DMA transfer is completed in a short time compared with the constant cycle $\Delta T$. After transferring the image to data storage unit 43, processing unit 41 performs the process below using a vacant time of $\Delta T$ (sec) excluding the time required for the DMA transfer.

Processing unit 41 executes the following process before outputting a starting trigger, as an initialization process. First of all, the position of a pixel in an image is set as (x, y), the luminance of the pixel is set as G[n](x, y), a two-dimensional array storing the maximum luminance of each pixel is set as Gmax[k](x, y), and a two-dimensional array storing the number of the image exhibiting the maximum luminance is set as IDmax[k](x, y). Here, k corresponds to the number in FIG. 7. The number k is allocated in order from one.

The image transferred to data storage unit 43 is allocated a number n in the order of transfer. Here, n is incremented by one every time an image is transferred. The position Z of Z stage 7 at present is $Z=(n-1)\times\Delta T\times v$.

Here, in FIG. 7, a function that returns the maximum Zp satisfying $Zp\leq Z$ is written as Zf(Z), n=1 is set as an initial state, and Z is calculated based on Equation ($Z=(n-1)\times\Delta T\times v$) above to obtain Zc=Zf(Z). Each element of Gmax[k](x, y) is initialized to zero, and each element of IDmax[k](x, y) is initialized to −1. When Z=0, the maximum Zp that satisfies $Zp\leq 0$ is zero, based on FIG. 7. When Z=10, Zp that satisfies $Zp\leq 10$ is zero, based on FIG. 7. When Z=11, the maximum Zp that satisfies $Zp\leq 11$ is 10, based on FIG. 7.

After the initialization process as described above, processing unit 41 compares G[n](x, y) that satisfies $GL\leq G[n](x, y)-G[n-1](x, y)$ with Gmax[k](x, y), for each pixel, every time an image is transferred to data storage unit 43, and replaces Gmax[k](x, y) with G[n](x, y) and replaces IDmax[k](x, y) with n when Gmax[k](x, y)<G[n](x, y) is satisfied. This process is repeated while Zc at present agrees with Zf(Z). GL is the lower limit value of the amount of change in luminance (interference light intensity). When Z is 0 to 10, Zf(Z)=0, and when Z is equal to or greater than 11, Zf(Z)=10. Therefore, when Z=11, Zc=0 at present becomes Zf(Z)=10 and does not agree.

When Zc does not agree with Zf(Z), Zc=Zf(Z) is set, and k is incremented by one. Each element of Gmax[k](x, y) is initialized to zero, and each element of IDmax[k](x, y) is initialized to −1. When k becomes greater than the maximum number (that is, two) in FIG. 7, this step ends. In Gmax[k](x, y), the maximum value of luminance of each pixel in the range of each number in FIG. 7, or zero is stored. In IDmax[k](x, y), the number of the image with the highest luminance or −1 is stored.

Next, step S3 of detecting a focus position will be described. At step S3, processing unit 41 detects the accurate focus position of each pixel, based on IDmax[k](x, y) obtained at step S2. This process is executed for a pixel for which the number of the image with the largest luminance is stored in IDmax[k](x, y) and is not executed for a pixel for which −1 is stored in IDmax[k](x, y).

That is, processing unit 41 executes the following process for each k. It is assumed that m=IDmax[k] (x, y). For the (m−M)-th to (m+M)-th images j, M[j](x, y) in Equation (5) below is calculated for each pixel (x, y) on the image. M is a positive integer, for example, five.

$$M[j](x, y) = \frac{\sqrt{(G[j-1](x, y) - G[j+1](x, y))^2 - (G[j-2](x, y) - G[j](x, y))(G[j](x, y) - G[j+2](x, y))}}{2} \quad (5)$$

M[j](x, y) represents the envelope of a curve representing the relation between coordinate value Z in the optical axis direction of Z stage 7 and the intensity of interference light, as illustrated in FIG. 11. Next, focus position f[k](x, y) of each pixel is obtained using M[j](x, y) above, based on Equation (6) below.

$$f[k](x, y) = \frac{\sum_{j=m-M}^{m+M} M[j](x, y) \times j}{\sum_{j=m-M}^{m+M} M[j](x, y)} \quad (6)$$

Equation (6) above is a formula for obtaining the centroid of the envelope. When data is left-right symmetric about the vertex as in the envelope in FIG. 11, the centroid indicates the center position thereof. Here, using the image capturing cycle $\Delta T$ and the moving speed v (μm/sec) of Z stage 7, the focus position array F[k](x, y) in f[k](x, y) is written as $F[k](x, y) = \Delta T \times v \times f[k](x, y)$.

Finally, step S4 of detecting the height will be described. At step S4, processing unit 41 detects the height of surface 53a of paste film 53 with reference to the surface of metal film 52 previously described. That is, processing unit 41 sets an image region corresponding to the surface of metal film 52 and an image region corresponding to surface 53a of paste film 53, for each stage in FIG. 7, in advance. These regions are specified by coordinate values with the origin at a certain reference position on the image, and the reference position is detected by, for example, a known pattern matching method.

In this example, the surface of metal film 52 was set corresponding to stage 1, and surface 53a of paste film 53 was set corresponding to stage 2. For the surface of metal film 52, the height was obtained from the focus position of a pixel (x, y) where IDmax[1]≠−1, using IDmax[1] of stage 1. For surface 53a of paste film 53, the height was obtained from the focus position of a pixel (x, y) where IDmax[2]≠−1, using IDmax[2] of stage 2. For metal film 52, the mean value Zar in a region corresponding to the surface of metal film 52 in coordinate array F[1] was calculated, and the maximum value Zh in a region corresponding to surface 53a of paste film 53 in coordinate array F[2] was calculated. The relative height ΔZ finally obtained is ΔZ=Zh−Zar.

When surface 53a of paste film 53 is a flat surface, the mean value may be used. In this case, the mean value Za of coordinate array F[2] in the region corresponding to surface 53a of paste film 53 is calculated. The obtained relative height ΔZ is ΔZ=Za−Zar.

In this embodiment, while two-beam interference objective lens 4 is moved relative to paste film 53 in the optical axis direction, the brightness of white light is successively changed from the first level to the second level in accordance with the position of Z stage 7, and the image of interference light is captured. For each pixel of the captured image, the position of Z stage 7 where the intensity of interference light is highest in a period during which the brightness of white light is set to the first or second level is detected as a focus position, and the height of paste film 53 is obtained based on the detection result. Therefore, the height of paste film 53 can be detected accurately by setting the level of the brightness of white light appropriately in accordance with the properties of paste film 53 and the neighboring metal film 52.

[Configuration of Coating Apparatus]

Figure 12:
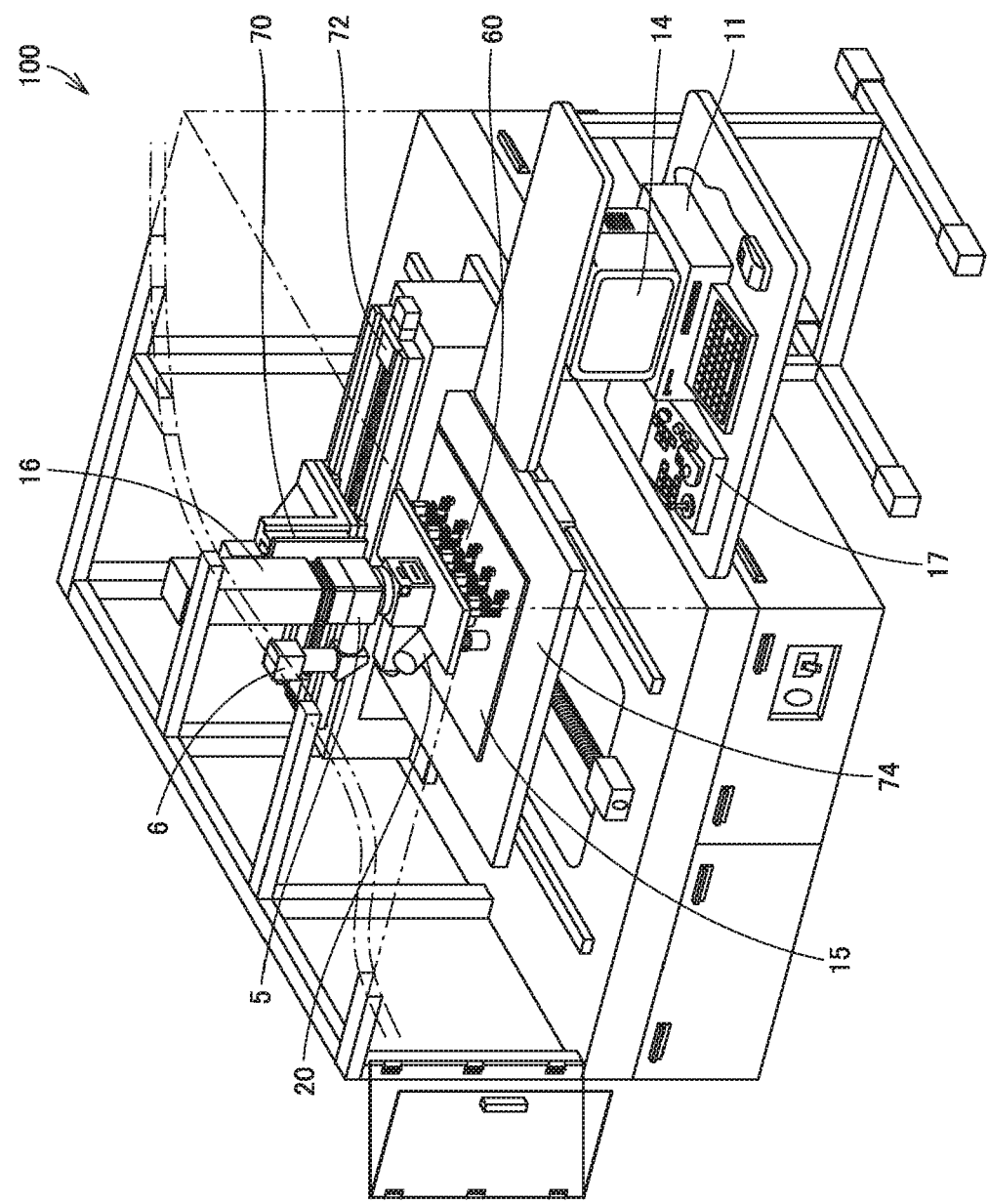
FIG. 12 is a perspective view illustrating an overall configuration of a coating apparatus equipped with the height detection apparatus according to the present embodiment.

FIG. 12 is a perspective view illustrating an overall configuration of coating apparatus 100 equipped with height detection apparatus 1 according to the present embodiment. Coating apparatus 100 according to the present embodiment is configured to apply a transparent paste (liquid material) in layers on a main surface of work (substrate) 15. Referring to FIG. 12, coating apparatus 100 includes a coating head having an observation optical system 5, an imaging device (CCD camera) 6, a cutting laser device 16, a coating mechanism 60, and a curing light source 20, a Z table 70 for moving the coating head as a whole relative to substrate 15 to be coated in the vertical direction (Z-axis direction), an X table 72 for moving Z table 70 mounted thereon in the X-axis direction, a Y table 74 for moving substrate 15 mounted thereon in the Y-axis direction, a control computer (control device) 11 for controlling the operation of the entire apparatus, a monitor 14 for displaying, for example, an image captured by CCD camera 6, and an operation panel 17 for inputting a command from operators to control computer 11.

Observation optical system 5 includes an illumination light source to observe the surface state of substrate 15 and the state of paste applied by coating mechanism 60. The image observed by observation optical system 5 is converted by CCD camera 6 into an electrical signal and displayed on monitor 14. Cutting laser device 16 applies laser light to remove an unnecessary portion on substrate 15 through observation optical system 5.

Coating mechanism 60 applies paste on the main surface of substrate 15. Curing light source 20 includes, for example, a CO2 laser to apply laser light to cure the paste applied by coating mechanism 60.

This apparatus configuration is illustrated by way of example. The configuration may be, for example, a gantry system in which Z table 70 having observation optical system 5 and the like mounted thereon is mounted on the X table, X table 72 is further mounted on the Y table, and Z table 70 is movable in the XY direction. Any configuration may be employed as long as Z table 70 having observation optical system 5 and the like mounted thereon is movable relative to the target substrate 15 in the XY direction.

The head (FIG. 3) of height detection apparatus 1 according to the present embodiment is provided, for example, at observation optical system 5 of coating apparatus 100. Control computer 11 controls coating mechanism 60 to perform the operation of applying paste and thereafter moves X table 72, Y table 74, and Z table 70 to position the head at a predetermined position above the surface of the paste-coated portion (transparent film). Control computer 11 further captures an image of interference light using CCD camera 6 while moving Z stage 7 relative to substrate 15. Control computer 11 detects the Z stage position where interference light intensity is peak for each pixel and calculates the film thickness of the paste-coated portion (transparent film) or the height of the rough portion using the detected Z stage position.

Figure 13:
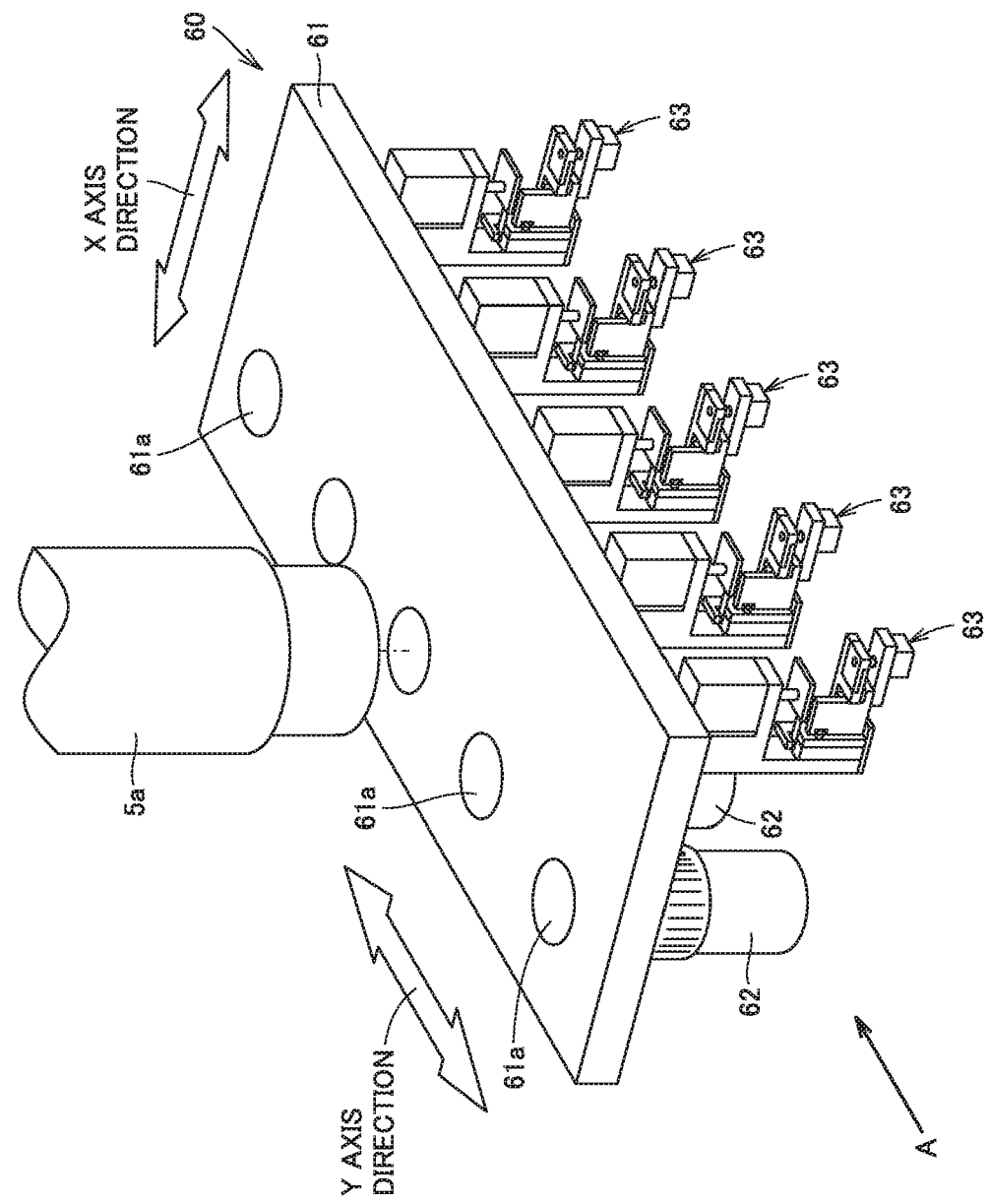
FIG. 13 is a perspective view illustrating a main part of the observation optical system and the coating mechanism.

Next, an example of the coating mechanism using a plurality of coating needles will be described. FIG. 13 is a perspective view illustrating the main part of observation optical system 5 and coating mechanism 60. Referring to FIG. 13, this coating apparatus 100 includes a movable plate 61, a plurality of (for example, five) objective lenses 62 with different magnifications, and a plurality of (for example, five) coating units 63 for applying pastes of different materials.

Movable plate 61 is provided to be movable in the X-axis direction and the Y-axis direction between the lower end of an observation barrel 5a of observation optical system 5 and substrate 15. Movable plate 61 has, for example, five through holes 61a.

Objective lenses 62 are fixed to a lower surface of movable plate 61 so as to correspond to through holes 61a at predetermined intervals in the Y-axis direction. Five coating units 63 are disposed adjacent to five objective lenses 62, respectively. Moving movable plate 61 allows the desired coating unit 63 to be arranged above the target substrate 15.

Figure 14:
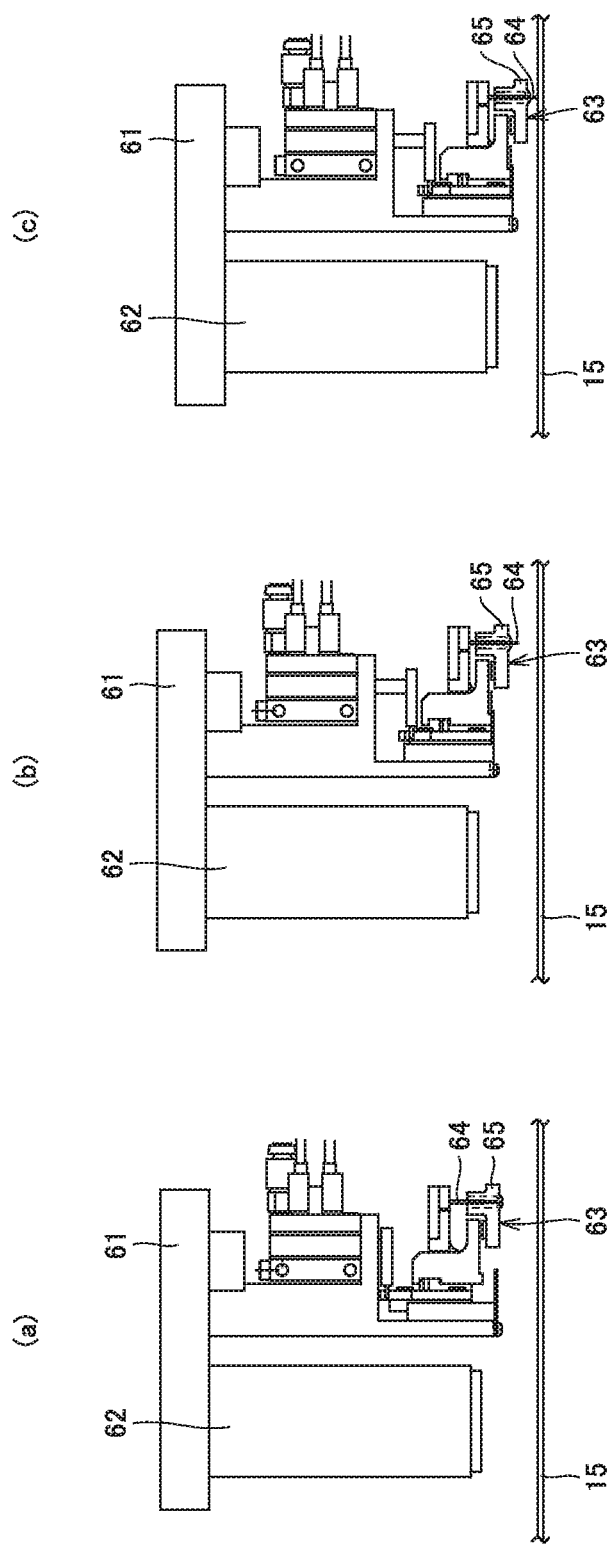
FIG. 14 is a diagram illustrating the main part as viewed from direction A in FIG. 13.
Figure 15:
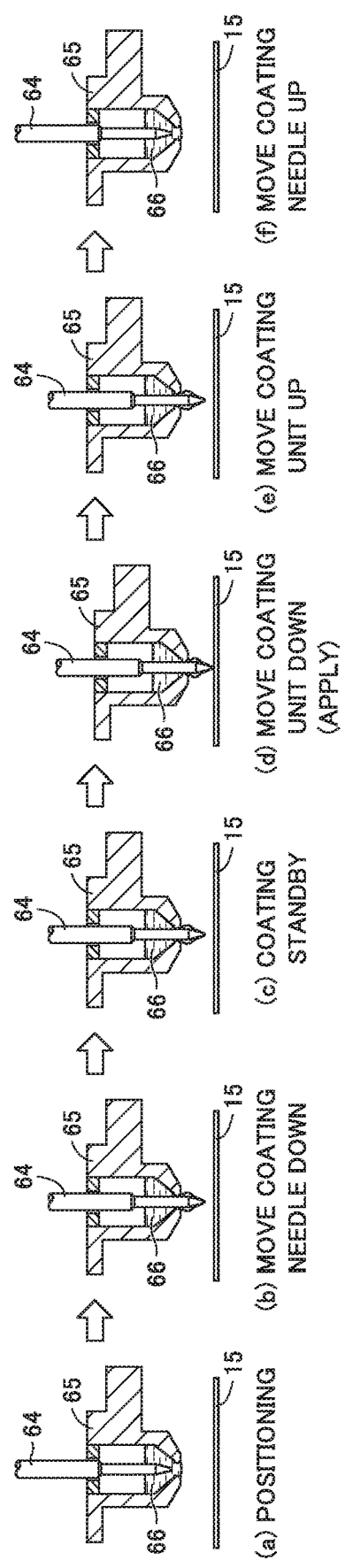
FIG. 15 is a diagram for explaining the detail of a coating operation.

FIG. 14 is a diagram illustrating the main part as viewed from direction A in FIG. 13 and illustrates the paste coating operation. Coating unit 63 includes a coating needle 64 and a tank 65 for storing paste 66. FIG. 15 is an enlarged view illustrating the operation of coating needle 64 and tank 65 in the coating operation.

Referring to FIG. 14 and FIG. 15, first of all, as illustrated in FIG. 14(a) and FIG. 15(a), coating needle 64 of coating unit 63 as desired is positioned above substrate 15 to be coated. Here, the tip end of coating needle 64 is soaked in paste 66 in tank 65.

Then, as illustrated in FIG. 14(b) and FIG. 15(b), coating needle 64 is moved down so that the top end of coating needle 64 protrudes from a hole at the bottom of tank 65. Here, paste 66 adheres to the top end of coating needle 64, but the tip end is not yet in contact with substrate 15. In this state, as described later, coating is on standby for a predetermined time (for example, about 0 to 300 msec) in order to adjust the amount of coating (FIG. 15(c)).

After the elapse of a predetermined time, as illustrated in FIG. 14(c) and FIG. 15(d), coating unit 63 is moved down to bring the tip end of coating needle 64 into contact with substrate 15 and apply paste 66 on substrate 15. Also at this point of time, the amount of coating can be adjusted by adjusting the contact time between coating needle 64 and substrate 15.

After the elapse of a predetermined contact time, coating unit 63 is moved up (FIG. 15(*e*)), coating needle 64 is also moved up, and the coating operation ends (FIG. 15(*f*)).

Figure 16:
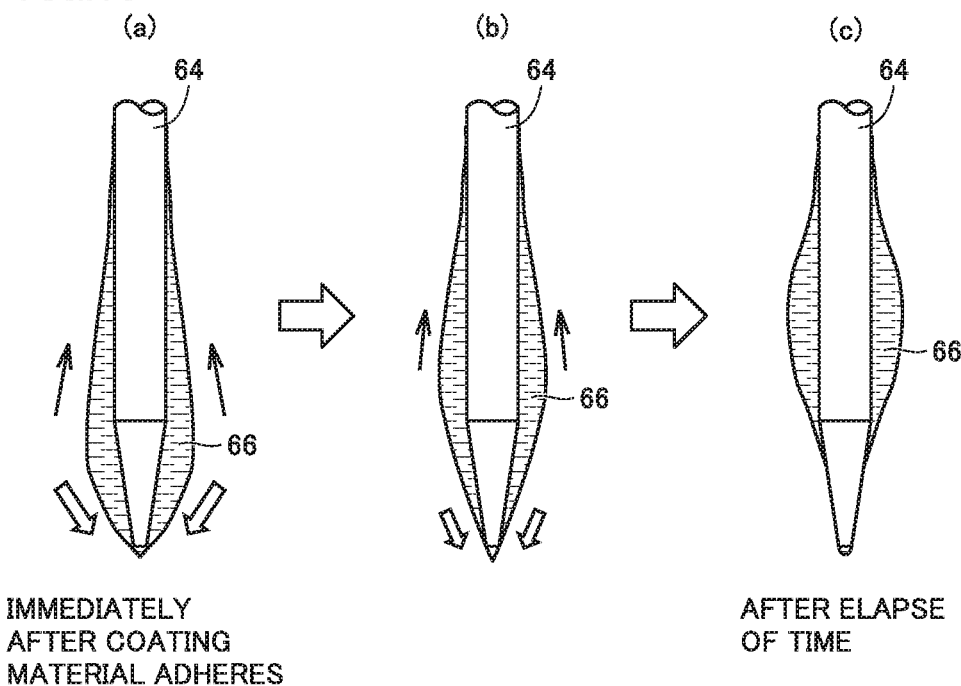
FIG. 16 is a diagram for explaining behavior of paste during coating standby.

The adjustment of the amount of coating illustrated in FIGS. 15(*c*) and 15(*d*) will be described with reference to FIGS. 16 to 20 below. FIG. 16 illustrates the behavior of paste 66 when the coating operation is on standby with coating needle 64 protruding from the hole at the bottom of tank 65 in FIG. 15(*c*).

As illustrated in FIG. 16(*a*), paste 66 adheres to the lower side of coating needle 64 immediately after coating needle 64 protrudes from the hole at the bottom of tank 65, and paste 66 moves up coating needle 64 over time due to the viscosity of paste 66 and the effect of surface tension (FIG. 16(*b*)). In this state, the paste adhering to the tip end of coating needle 64 is continuous to the paste adhering to the side surface portion of coating needle 64. Therefore, when coating needle 64 is brought into contact with substrate 15 in this state, the paste adhering to the tip end of coating needle 64 as well as part of the paste adhering to the side surface portion is applied on substrate 15. On the other hand, after the elapse of a sufficient coating standby time, as illustrated in FIG. 16(*c*), the paste on the side surface portion of coating needle 64 further moves up and becomes separate from the paste adhering to the tip end of coating needle 64. When coating needle 64 is brought into contact with substrate 15 in this state, the paste adhering to the side surface portion of coating needle 64 is not applied on substrate 15, and only the paste adhering to the tip end of coating needle 64 is applied on substrate 15. That is, the amount of coating can be adjusted by adjusting the coating standby time.

Figure 17:
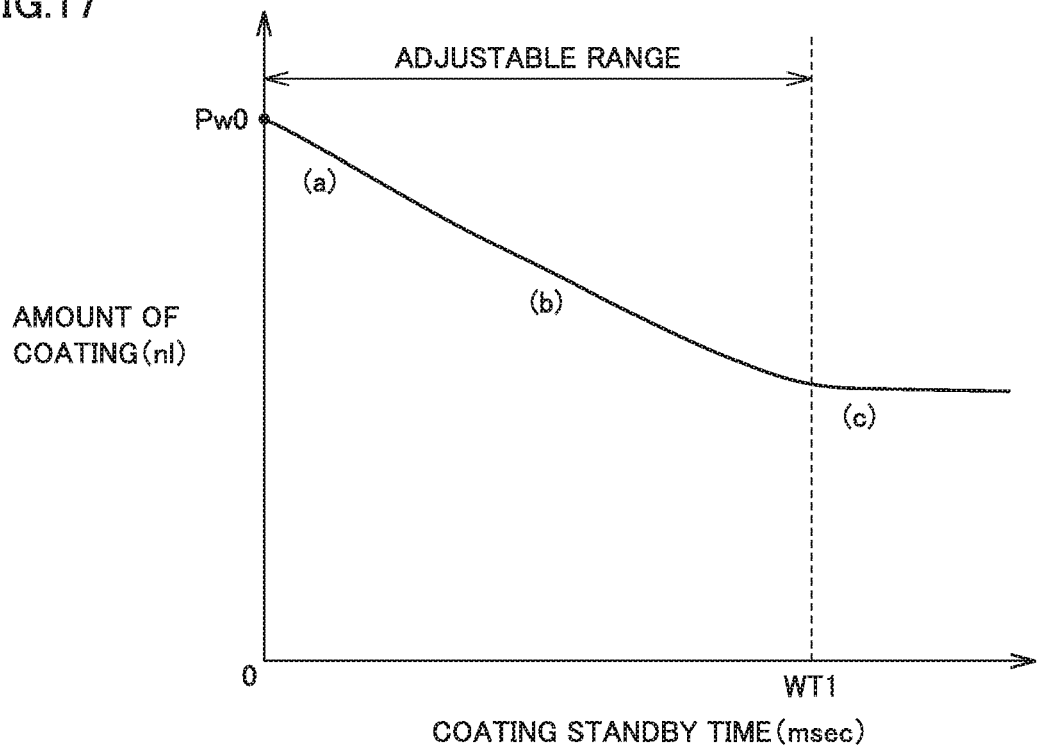
FIG. 17 is a diagram illustrating an example of the relation between the coating standby time and the amount of coating.

FIG. 17 is a diagram illustrating an example of the relation between the coating standby time of coating needle 64 and the amount of coating. In FIG. 17, the horizontal axis represents the coating standby time, and the vertical axis represents the amount of coating applied on substrate 15. In FIG. 17, it is assumed that the contact time between coating needle 64 and substrate 15 is the same.

As illustrated in FIG. 17, as the standby time increases, the amount of coating gradually decreases from the state of the amount of coating Pw0 (corresponding to FIG. 16(*a*)) with the standby time of zero. After the standby time of WT1 in the figure, the amount of coating is almost constant because the paste adhering to the tip end of coating needle 64 becomes separate from the paste adhering to the side surface portion, as illustrated in FIG. 16(*c*).

Since the shorter standby time is preferable in terms of the cycle time of the apparatus, a zero standby time is set as the initial state, and then the adjustment for decreasing the amount of coating is achieved by adjusting (increasing) the standby time.

Figure 18:
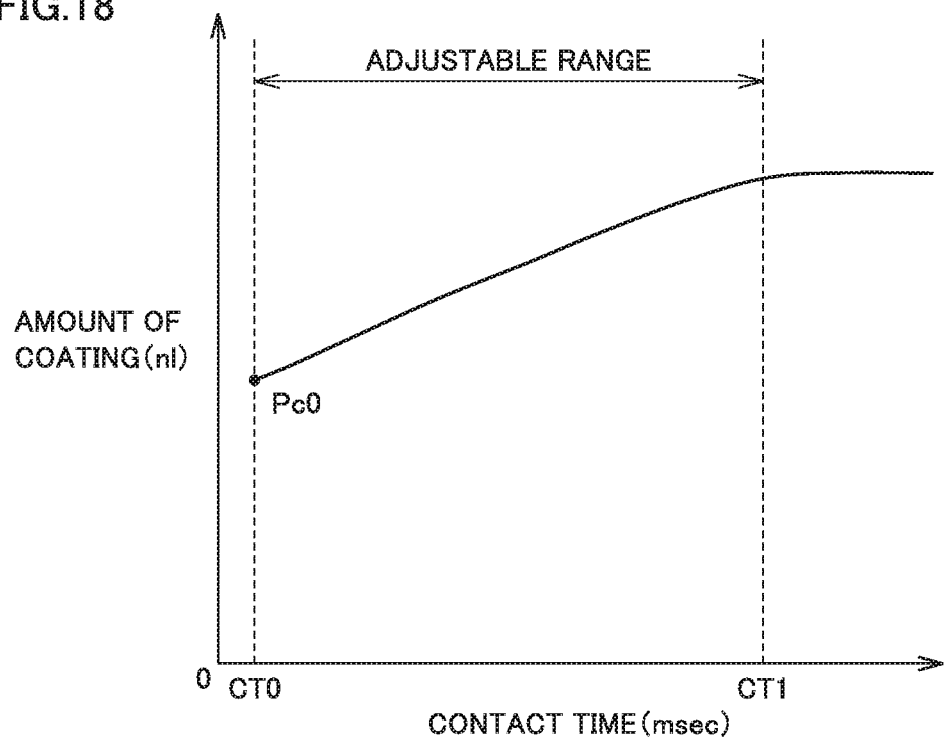
FIG. 18 is a diagram illustrating an example of the relation between the contact time of the coating needle and the amount of coating.

FIG. 18 is a diagram illustrating an example of the relation between the contact time between coating needle 64 and substrate 15 and the amount of coating. In FIG. 18, the horizontal axis represents the contact time between coating needle 64 and substrate 15, and the vertical axis represents the amount of coating applied on substrate 15. In FIG. 18, it is assumed that the coating standby time is constant.

Referring to FIG. 18, when the minimum contact time between coating needle 64 and substrate 15 is CT0, the initial amount of coating Pc0 gradually increases as the contact time increases. When the contact time exceeds CT1, the amount of coating is almost constant. This is also because the paste adhering to coating needle 64 easily spreads along substrate 15 as the contact time increases, due to the viscosity of paste 66 and the effect of surface tension.

Since the shorter contact time is also preferable in terms of the cycle time of the apparatus, the amount of coating Pc0 with the minimum contact time of CT0 is set as the initial state, and then the adjustment for increasing the amount of coating is achieved by adjusting (increasing) the contact time.

An example of the parameter for adjusting the contact time can be the time count from the point of time when coating needle 64 comes into contact with substrate 15. In this case, the contact between substrate 15 and coating needle 64 can be determined based on, for example, contact pressure, electric resistance, or a change in position of the Z stage. Alternatively, the "amount of push" of coating needle 64 when coating unit 63 is moved down may be set as a parameter.

Figure 19:
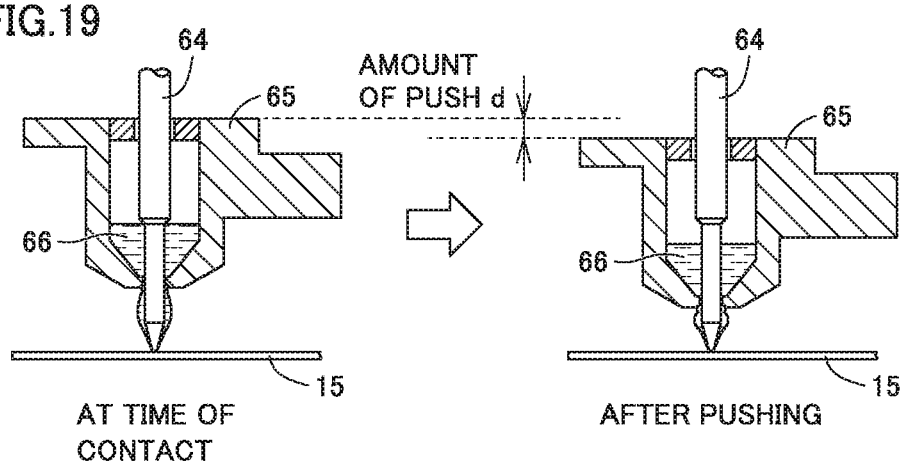
FIG. 19 is a diagram for explaining pushing of the coating needle during coating operation.

Here, the "amount of push" of coating needle 64 is the amount of coating unit 63 further moving down from the contact state between substrate 15 and coating needle 64, as illustrated in FIG. 19. Alternatively, the "amount of push" can be said as the amount of coating needle 64 pushed back into tank 65. Coating needle 64 is provided with a not-shown slide mechanism to release force applied in the pushed state as illustrated in FIG. 19 by moving down coating unit 63. By setting this amount of push d as a parameter, the time parameter can be set as a parameter of moving distance (that is, position) of the Z stage.

Figure 20:
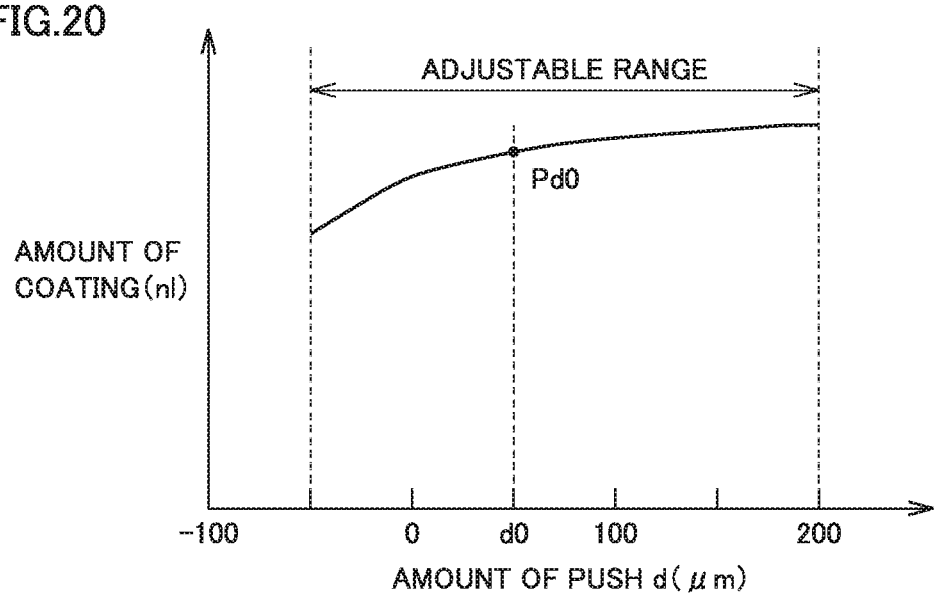
FIG. 20 is a diagram illustrating an example of the relation between the amount of push of the coating needle and the amount of coating.

FIG. 20 is a diagram illustrating an example of the relation between the amount of push d of coating needle 64 and the amount of coating. In FIG. 20, the horizontal axis represents the amount of push, and the vertical axis represents the amount of coating applied on substrate 15. Here, FIG. 20 illustrates the amount of coating when the amount of push is negative. This is because even when coating needle 64 is not actually in contact with substrate 15, paste may be in contact with substrate 15 because of the amount of paste protruding from the tip end.

In order to ensure the contact between coating needle 64 and substrate 15 and prevent coating failure, the amount of push d is generally set to a value d0 (for example, 50 μm) slightly positive relative to zero. Therefore, when the amount of coating Pd0 in this state is set as the initial state, the adjustment for increasing the amount of coating is achieved by increasing the amount of push d.

A variety of other techniques are known as the coating mechanism using a plurality of coating needles (for example, PTD 2). Coating apparatus 100 can use, for example, the mechanism as described above as coating mechanism 60 to apply a desired paste of a plurality of pastes and to apply a paste using a coating needle having a desired coating diameter of a plurality of coating needles.

[Paste Application Method]

Figure 21:
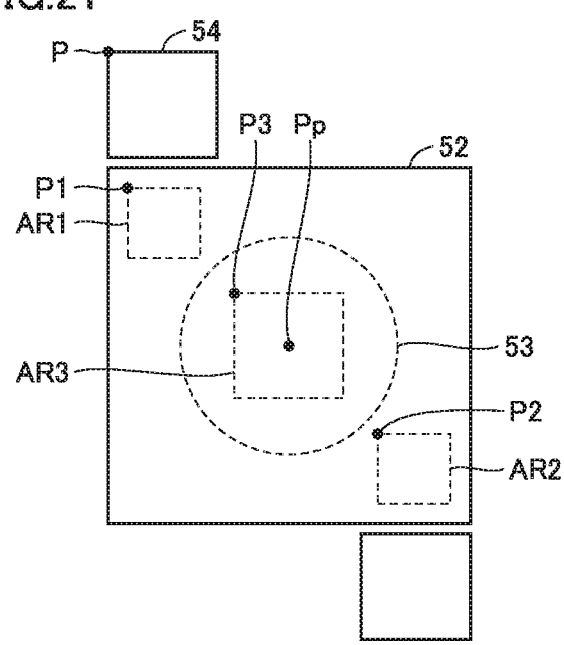
FIG. 21 is a diagram of a coating region as viewed from above.

Referring now to FIG. 21 and FIG. 22, a specific method of applying paste and adjusting the amount of coating will be described. FIG. 21 is a diagram of one of two target objects illustrated in FIG. 8 as viewed from above paste film 53. Here, the surface of metal film 52 corresponding to stage 1 described above is surface AR1, AR2 in FIG. 21. Surface 53*a* of paste film 53 corresponding to stage 2 is surface AR3 in FIG. 21. FIG. 22 is a flowchart illustrating the process of applying paste and adjusting the amount of coating that is executed in a control computer 11 executed in this coating apparatus.

In FIG. 21, surfaces AR1 to AR3 are rectangular, and the coordinates P1, P2, P3 at the respective upper left ends of the regions of surfaces AR1 to AR3 in FIG. 21 are coordinate values with the origin at the upper left end P of film 54, and are set as P1(x1, y1), P2(x2, y2), P3(x3, y3), respectively. The sizes (vertical, horizontal) of the rectangular shapes of surfaces AR1 to AR3 are (w1, w1), (w2, w2), (w3, w3). Similarly, the paste-coated position Pp is represented by coordinate values Pp(xp, yp) with the origin at the upper left end P of film 54. These coordinate values are coordinates of an image of CCD camera 6. Then, the coordinate value of upper left end P of film 54, the paste-coated position Pp(xp, yp), and the coordinate values P1(x1, y1), P2(x2, y2), P3(x3, y3) of the upper left ends of the regions are stored in control computer 11 of coating apparatus 100 in advance.

Control computer 11 of coating apparatus 100 controls Z stage 7 to obtain focus on a surface of substrate 15 (step S100). Here, the focus is obtained by the method, for example, described in PTD 1 (Japanese Patent Laying-Open No. 2000-56210).

Next, control computer 11 detects the position of upper left end P of film 54. In this detection, known pattern matching methods such as normalized correlation and sequential similarity detection can be used. The interference pattern appearing on the film surface is not always the same because Z stage 7 does not always stop at the same position due to the effect of the accuracy in detection of focusing initially executed. Therefore, if an interference pattern occurs during execution of pattern matching, contrast of the template is produced, and a pattern mismatch may be determined. It is thus preferable that pattern matching is performed in a state in which an interference pattern on the film surface disappears, by minutely moving Z stage 7.

As explained in FIG. 4, the intensity of interference light oscillates when a focus is approached, and the amplitude peaks at the focus position. The distance in the optical axis direction where oscillation appears is about a few μm, and in the present embodiment, this distance is called "coherence length". For example, Z stage 7 is moved to the same degree as the coherence length to allow the interference pattern to disappear. The coherence length may be measured by obtaining the waveform in FIG. 4 in advance, and the appropriate amount of move may be stored as a coherence length in control computer 11.

Control computer 11 moves Z stage 7 by a coherence length (step S110) and then executes pattern matching to calculate the XY stage coordinates of paste-coated position Pp (step S120). In the pattern matching, the coordinates of upper left end P of film 54 are detected. Here, the coordinates of upper left end P are (x, y). The resolution of CCD camera 6 is (w, h), the size of one pixel is m (where the pixel is square, and m>0), and the present position of X table 72 and Y table 74 is (xs, ys). Here, supposing that the XY stage position (xs, ys) corresponds to the center position of CCD camera 6, the XY stage coordinates of paste-coated position Pp can be represented by Expression (7) below.

$$(xs+mx(x+xp-w/2), ys-mx(y+yp-h/2)) \quad (7)$$

After performing pattern matching, control computer 11 returns Z stage 7 to the original position (step S130) and then moves X table 72 and Y table 74 to the coordinates calculated using Expression (7). Paste-coated position Pp is thus positioned at the center of CCD camera 6.

Subsequently, control computer 11 obtains focus on the surface AR1 of metal film 52 (step S140). The brightness of each pixel of surface AR1 changes as illustrated in FIG. 4. Since surface AR1 is coplanar, the peak in FIG. 4 also appears at the substantially same position on the optical axis. Control computer 11 then moves Z stage 7 in the up-down direction, and the Z stage position where the brightness is highest is obtained for each pixel of surface AR1. Then, the mean value of the Z stage position when the brightness is highest for all the pixels of surface AR1 is calculated, and Z stage 7 is moved to the position indicated by the mean value. This brings surface AR1 of metal film 52 into a state in which an interference pattern appears.

Subsequently, control computer 11 applies paste on metal film 52 (step S150) and detects the height of the applied paste film 53 (step S160). Specifically, control computer 11 calculates the mean value Zar of the heights of surfaces AR1, AR2 of metal film 52 from a focus position array F[1] and calculates the maximum value a of the height of surface AR3 of paste film 53 from a focus position array F[2]. Control computer 11 then calculates the relative height ΔZ between paste film 53 and metal film 52 as ΔZ=|Zh−Zar| (step S170).

It is noted that the film thickness of paste film 53 may vary over time due to change of paste viscosity over time. Therefore, when relative height ΔZ falls below a predetermined lower limit value ZL or exceeds a predetermined upper limit value ZH, control computer 11 changes the coating conditions as described below.

More specifically, control computer 11 determines whether relative height ΔZ falls below lower limit value ZL (step S180). If relative height ΔZ falls below lower limit value ZL (YES at step S180), control computer 11 determines that the amount of coating is insufficient and adjusts the parameters such that the amount of coating is increased in the next coating operation (step S190). Specifically, as explained in FIG. 18 and FIG. 20, control computer 11 adjusts the parameters such that the contact time CT between coating needle 64 and substrate 15 or the amount of push d of coating needle 64 is increased.

If relative height ΔZ is equal to or greater than lower limit value ZL (NO at step S180), control computer 11 then determines whether relative height ΔZ exceeds upper limit value ZH (step S185). If relative height ΔZ exceeds upper limit value ZH (YES at step S185), control computer 11 determines that the amount of coating is excessive and adjusts the parameters such that the amount of coating is reduced in the next coating operation (step S195). Specifically, as explained in FIG. 17, the parameters are adjusted such that coating standby time WT is increased in the next coating operation. If relative height ΔZ is equal to or smaller than upper limit value ZH (NO at step S185), control computer 11 determines that the amount of coating is adequate, and the process then ends.

In steps S190 and S195 above, the description has been given on the precondition that the amount of coating is adjusted, starting from each parameter in the initial state (that is, the coating standby time is 0, the contact time is CT0, and the amount of push is d0). However, for example, in the case where the parameters have been adjusted such that coating standby time WT is increased in order to reduce the amount of coating in the previous determination, if increasing the amount of coating is necessary in the current determination, it is preferable that coating standby time WT is reduced, first, and then if the required amount of coating is still not satisfied, the contact time CT or the amount of push d is adjusted.

Control is performed in accordance with the processing above in control computer 11 so that paste is applied to a desired position and the amount of coating is adjusted.

The embodiment disclosed here should be understood as being illustrative rather than being limitative in all respects. The scope of the present invention is shown not in the foregoing description but in the claims, and it is intended that all modifications that come within the meaning and range of equivalence to the claims are embraced here.

REFERENCE SIGNS LIST 1 height detection apparatus, 2 light source, 3 light source controller, 4 two-beam interference objective lens, 5 observation optical system, 5a observation barrel, 6 imaging device, 7 Z stage, 8 Z stage controller, 9 support member, 10 base plate, 11 control device, 12 keyboard, 13 mouse, 14 monitor, 15 work (substrate), 16 cutting laser device, 17 operation panel, 20 curing light source, 21 lens, 22 reference mirror, 23 beam splitter, 31 condenser lens, 32 half mirror, 33 image lens, 34 filter, 41 processing unit, 42 image input unit, 43 data storage unit, 44 position control value output unit, 45 illumination control value output unit, 51 substrate, 52 metal film, 53 paste film, 53a, AR1 to AR3 surface, 54 film, 60 coating mechanism, 61 movable plate, 61a through hole, 62 objective lens, 63 coating unit, 64 coating needle, 65 tank, 66 paste, 70 Z table, 72 X table, 74 Y table, 100 coating apparatus.

The invention claimed is:

1. A height detection apparatus configured to detect a height of a target object, comprising:
   a light source configured to emit white light;
   a two-beam interference objective lens configured to divide white light emitted from the light source into two light beams, apply one of the two light beams to the target object and the other light beam to a reference surface, and cause interference between reflected light from the target object and reflected light from the reference surface to obtain interference light;
   an imaging device configured to capture an image of interference light obtained by the two-beam interference objective lens;
   a Z stage configured to move the two-beam interference objective lens relative to the target object in an optical axis direction; and
   a control device configured to control the light source, the imaging device, and the Z stage to obtain a height of the target object,
   the control device being configured to:
   successively change brightness of the white light in first to K-th levels in accordance with a position of the Z stage and capture an image of the interference light, while moving the two-beam interference objective lens relative to the target object in the optical axis direction;
   detect, as a focus position, a position of the Z stage where intensity of the interference light is highest in a period during which the brightness of the white light is set to a k-th level, for each pixel of the captured image; and
   obtain the height of the target object, based on a detection result, where K is an integer equal to or greater than two, and k is any integer from 1 to K.

2. The height detection apparatus according to claim 1, wherein the control device is configured to detect, as a maximum intensity, the intensity of the interference light corresponding to a centroid of an envelope of a curve representing a relation between a position of the Z stage and the intensity of the interference light in a period during which the brightness of the white light is set to the k-th level, and to set the position of the Z stage corresponding to the detected maximum intensity as the focus position.

3. The height detection apparatus according to claim 1, wherein the control device is configured to set first to K-th process regions corresponding to the first to k-th levels in an image, detect at least one of a vertex or a mean value of the focus position for each process region, and detect the height of the target object based on a detection result.

4. The height detection apparatus according to claim 1, wherein
   the control device is configured to execute:
   a first step of generating a first command value array for specifying a position of the Z stage such that the Z stage moves at a constant speed and a second command value array for specifying brightness of the white light such that brightness of the white light successively changes in the first to K-th levels in accordance with a position of the Z stage;
   a second step of loading an image captured by the imaging device in a constant cycle while controlling the position of the Z stage and the brightness of the white light based on the first and second command value arrays, and obtaining a number of an image in which luminance of a pixel is highest in a period during which the brightness of the white light is set to the k-th level;
   a third step of obtaining an envelope of a curve representing a relation between the position of the Z stage and the intensity of the interference light, for each pixel of an image, using the number of the image and luminance of the loaded image, detecting a number of an image in which the envelope is largest, and detecting, as a focus position, the position of the Z stage obtained by converting the number of the obtained image; and
   a fourth step of obtaining the height of the target object based on the focus position obtained for each pixel of the image.

5. The height detection apparatus according to claim 4, wherein in the second step, a number of an image in which luminance of a pixel is highest in a period during which the brightness of the white light is set to the k-th level is obtained by obtaining a number of an image in which a difference between the luminance of a pixel in an image loaded this time and the luminance of a pixel in an image loaded previously is equal to or greater than a predetermined threshold and is largest in each constant cycle.

6. The height detection apparatus according to claim 4, wherein in the third step, a number of an image corresponding to a centroid of the envelope is obtained, and the position of the Z stage obtained by converting the obtained number of the image is detected as a focus position.

7. The height detection apparatus according to claim 4, wherein in the fourth step, the first to K-th process regions corresponding to the first to K-th levels are set in an image, at least one of a vertex or a mean value of the focus position is detected for each process region, and the height of the target object is obtained based on a detection result.

* * * * *